US005547717A

United States Patent [19]
Scaringella et al.

[11] Patent Number: 5,547,717
[45] Date of Patent: Aug. 20, 1996

[54] METHOD FOR DENSIFYING AND REFURBISHING BRAKES

[75] Inventors: David T. Scaringella, Littleton, Mass.; Donald E. Connors, Jr., Nashua, N.H.; Garrett S. Thurston, Lowell, Mass.

[73] Assignee: Avco Corporation, Providence, R.I.

[21] Appl. No.: 387,677

[22] Filed: Feb. 13, 1995

Related U.S. Application Data

[63] Continuation-in-part of Ser. No. 959,299, Oct. 9, 1992, Pat. No. 5,389,152.
[51] Int. Cl.$^6$ ........................................................ B05D 3/14
[52] U.S. Cl. .......................... 427/590; 427/140; 427/237; 427/238; 427/249; 427/294; 427/372.2; 427/591
[58] Field of Search ................................ 427/590, 140, 427/237, 238, 249, 294, 372.2, 591

[56] References Cited

U.S. PATENT DOCUMENTS

| | | | |
|---|---|---|---|
| 3,850,689 | 11/1974 | Basche et al. | 117/229 |
| 3,934,686 | 1/1976 | Stimson et al. | 188/218 |
| 3,948,363 | 4/1976 | Ely | 188/71.1 |
| 4,212,906 | 7/1980 | Fisher et al. | 427/237 |
| 4,465,165 | 8/1984 | Bok | 188/218 |
| 4,472,454 | 9/1984 | Houdayer et al. | 427/45.1 |
| 4,511,021 | 4/1985 | Grider | 188/218 |
| 4,557,356 | 12/1985 | Petersen | 188/218 |
| 4,613,021 | 9/1986 | Lacombe et al. | 188/218 |
| 4,804,071 | 2/1989 | Schultz et al. | 188/71.5 |
| 4,806,388 | 2/1989 | Mochizuki et al. | 427/46 |
| 4,837,073 | 6/1989 | McAllister et al. | 428/212 |
| 4,982,818 | 1/1991 | Pigford | 188/73.1 |
| 5,143,184 | 9/1992 | Snyder et al. | 188/218 |

FOREIGN PATENT DOCUMENTS

| | | | |
|---|---|---|---|
| 0515186 | 11/1992 | European Pat. Off. | C04B 41/87 |
| 3306029 | 8/1984 | Germany | C04B 41/28 |
| 2148187 | 10/1983 | United Kingdom | B32B 5/26 |

OTHER PUBLICATIONS

J. I. Morell, et al., "Pulsed-power volume-heating chemical vapor infiltration", *J. Mater. Res.* vol. 7, No. 9, Sep. 1992, pp. 2447–2456.

H. O. Pierson, et al., "Effects of deposition temperature on properties of pyrolytic carbon/carbon felt composites" Sandia Laboratory Report SC-DR-68-264, May 1968.

R. J. Bard, et al., "Pyrolytic carbon deposited in fluidized beds at 1200 to 1400° C. from various hydrocarbons", *Carbon* 1968, vol. 6, pp. 603–616, Pergamon Press, Great Britain. (no month avail.).

Chemical Vapor Deposition of Refractory Metals and Ceramics II, Materials Research Soc. Symp. Proceedings, vol. 250, Symposium held Dec. 4–6, 1991, Boston, MA, M. Besmann, et al., Editors.

M. L. Lieberman & H. O. Pierson, "Effect of Gas Phase conditions on Resultant Matrix Pyrocarbons in Carbon/Carbon Composites", *Carbon* 1974, vol. 12, pp. 233–241, Pergamon Press, Great Britain. (no month avail.).

M. L. Lieberman, et al. "CVD/PAN Felt Carbon/Carbon Composites", *J. Composite Materials*, vol. 9, Oct. 1975, p. 337.

H. M. Stoller, et al., "Carbon Fiber Reinforced–Carbon Matrix Composites", Proc. 1971 Fall Meeting of the Met Soc. of AiMe, Detroit, MI 1974, pp.69–136 (no month available).

H. O. Pierson & M. L. Lieberman, "The Chemical Vapor Deposition of Carbon on Carbon Fibers", *Carbon* 1973, vol. 13, pp. 139–166, Pergamon Press, Great Britain. (no month available).

(List continued on next page.)

*Primary Examiner*—Bernard Pianalto
*Attorney, Agent, or Firm*—Perman & Green

[57] ABSTRACT

Aircraft brakes are refurbished by a rapid chemical vapor deposition method utilizing a liquid carbon-precursor as a carbon source for carbon densification. Inductive and resistive heating means are utilized to carry out the method.

23 Claims, 6 Drawing Sheets

OTHER PUBLICATIONS

H. O. Pierson, et al., "Structures, Properties and Process Parameters of Matrices in Carbon/Carbon Composites", Sandia Laboratory Report SLA-73-0208, Mar. 1973.

D. W. Bauer & W. V. Kotlensky, "Relationship Between Structure and Strength for CVD Carbon Infiltrated Substrates", 4th Internal, SAMPE Conf., pp. 24-38, 1972. (no month avail.).

J. W. Warren & R. M. Williams, "Isothermal CVD processing", 4th Internal SAMPE Conf., Oct. 1972.

W. H. Pfeifer, et al., "Consolidation of Composite Structures by CVD", *Chemical Vapor Deposition PT. 2*. (no date avail.).

M. L. Lieberman, "Chemical Vapor Deposition of Carbon:A Model to Relate Gas Phase Conditions to Structure of Deposit", Proc. 3rd. Internat. Conf. on Chem. Vapor Deposition, p. 95, Amer. Nuclear Soc., 1972. (no month avail.).

G. Savage, "Carbon/Carbon Composite Materials", *Metals & Materials*, Sep. 1988, p. 544.

M. L. Lieberman & G. T. Noles, "Gas Analysis During the Chemical Vapor Deposition of Carbon", *Chemical Vapor Deposition*, Proc. 4th Internat. Conf. on Chem. Vapor Dep., Boston, MA, pp. 19-29, 1973 (no month available).

Erich Fitzer, "The Future of Carbon-Carbon Composites", Carbon vol. 25, No. 2, pp. 163-190 1987, Printed in Great Britain. (no month available).

Seh-Min Oh & Jai-Young Lee, "Effects of Matrix Structure on Mechanical Properties of Carbon/Carbon Composites", Carbon vol. 26, No. 6, pp. 769-776, 1988, Printed/Great Britain. (no month avail.).

Seh-Min Oh & Jai-Young Lee, "Structures of Pyrolytic Carbon Matrices in Carbon/Carbon Composites", Carb vol. 26, No. 6, pp. 763-768, 1988, Printed in Great Britain. (no month avail.).

BF Goodrich Aircraft Wheel and Brake Operations, Troy, Ohio, "Brakeliner" publication Summer 1989.

"Suppliers Strive to Extend Service Life, Cut Weight" Landing Systems, Aviation Week and Space Technology, vol. 131, No. 13, Sep. 25, 1989.

R. Fisher and J. V. Weaver, "The Use of Carbon/Carbon Composites in a New Generation of Aircraft Brakes" Conf. on Carbon and Graphite, Society of Chem. Ind., 1976, London. (no month avail.).

METHOD FOR DENSIFYING AND REFURBISHING BRAKES

This invention was made with Government support under Contract N00014-93-C-0088 awarded by the Department of the Navy. The Government has certain rights in the invention.

This is a continuation in part of U.S. Ser. No. 07/959,299, filed Oct. 9, 1992. U.S. Pat. No. 5,389,152

Carbon-carbon composite brakes are utilized on aircraft, such as the F-15 and F-16 military aircraft, for their safety, long life, and light weight. Present aircraft brake assemblies comprise rotors and stators assembled using carbon-carbon composite disc components. It has been demonstrated that the wear life of carbon brakes can be extended by subjecting used brakes to refurbishment procedures. However, the wear life of brakes refurbished by traditional methods is only 50–80% of new brakes. While this is an improvement over discarding the worn brakes altogether, if a refurbishment procedure was available which produced densified carbon material with a wear life more closely approaching that of original brakes, significant savings in original equipment and worn brake repair costs would result.

State-of-the-art carbon-carbon densification processes, including chemical vapor infiltration (CVI) and pitch or thermoset resin impregnation low pressure infiltration, require long processing times, on the order of 25 to 50 days. Such processes have been traditionally used to densify porous carbon preforms for original equipment carbon-carbon composite brake discs as well as to refurbish worn discs. The densification must be performed slowly so that the pores on the outside of the carbon brake do not get filled before the pores on the inside of the carbon brake. If the pores on the outside of the carbon brake are blocked before densification of the interior portions, insufficient precursor reaches the inner portions of the carbon brake and it is not fully densified.

One approach to avoid this problem is revealed in U.S. Pat. No. 4,472,454 issued Sep. 18, 1984 to Houdayer et al., which is hereby incorporated by reference. In that patent, the preform is placed in a reaction vessel and covered with a precursor liquid. A coil outside of the reaction vessel is used to inductively heat the preform. The preform is heated hot enough to boil the liquid precursor and pyrolyze the vapor generated when the liquid boils. We theorize that the liquid cools the preform at its exterior, thereby creating a thermal gradient through the thickness of the preform. The interior of the preform, since it is not cooled by the boiling liquid, is hot enough to pyrolyze the vapor. In this way densification occurs preferentially at the interior of the preform. The overall densification occurs from the inside outward. Densification can, thus, be performed at a higher rate without concern that the pores at the exterior will be blocked and prevent densification of the preform interior.

While the densification process as described in U.S. Pat. No. 4,472,454 reduces the time needed to densify a preform, we have discovered several ways in which the process could be improved.

First, in densifying a preform, it is desirable to have the induction coil conform to the shape of the preform It is also desirable to have the preform as close as possible to the induction coil. These requirements are important to provide uniform and efficient heating of the preform. Uniform heating is important to provide a desirable densification.

To adjust the apparatus of Houdayer et al. to meet these requirements entails reshaping the coil based on the shape of the part to be densified. It also entails reshaping the reaction vessel and coil for each part. Such a requirement is undesirable because it can be costly or time consuming. Moreover, we have discovered that cooling due to the boiling of the liquid, which is needed to create the desired temperature gradient, does not occur if the reaction vessel is too close to the preform. If walls of the reaction vessel are too close to the preform, a phenomenon called "vapor lock" can occur. In vapor lock, vapor builds up at some point between the wall of the reactor vessel and the preform, displacing the liquid. Convective heat transfer away from the preform is greatly reduced at that point, creating a hot spot and causing formation of deposits on the outside of the preform. As a result, the part is non-uniformly densified.

The method of refurbishing carbon-carbon composite brakes for aircraft disclosed herein will significantly reduce processing time, e.g., to 48 hours or less, and as a result, produce cost effective carbon-carbon components. In particular, this process is of interest for the fabrication of carbon aircraft brakes and the redensification or refurbishment of these brakes. Further, this chemical vapor deposition (CVD) process yields a densified carbon structure having a density similar to original equipment brake component(s) or refurbished brake component(s) approved for use in aircraft, e.g., at least 1.85 g/cc, preferably 1.9 g/cc in the deposited carbon matrix, and an appropriate CVD microstructure for a friction material, preferably a substantially non-isotropic microstructure. Such structural characteristics are needed to obtain the frictional wear characteristics appropriate for carbon aircraft brake components.

SUMMARY OF THE INVENTION

This invention provides:

1. A chemical vapor deposition method for refurbishing worn carbon brake component(s) for aircraft, comprising the steps:

a) placing at least one worn carbon brake component(s), having pores defined by interior regions, including at least one geometric center region, and an exterior surface, in a liquid carbon-precursor contained within a reactor for densifying a porous structure, the reactor being adapted to contain the liquid carbon-precursor and to contain at least one internal induction coil; and b) inductively heating the interior regions of the worn carbon brake component(s) to a temperature above the decomposition temperature of the liquid carbon-precursor, thereby effecting formation of a vapor from the liquid carbon-precursor and infiltration into the interior regions of the vapor and deposition of pyrolytic carbon within the interior regions; and whereby after refurbishing, the worn carbon brake component(s) are characterized by a micro structure and frictional wear characteristics at least equal to equivalent size, density and composition carbon brake component(s) presently in use in aircraft.

This invention also provides a chemical vapor deposition method of resistively heating carbon brakes to refurbish carbon lost during wear and methods of refurbishment combining resistive and inductive heating. For some brakes, these chemical vapor deposition methods may be completed in two to three and one- half hours at about 950° to 1100° C. at atmospheric pressure using cyclohexane precursor. A density of at least 1.85 g/cc and preferably 1.9 g/cc in the deposited matrices and an adequate CVD microstructure, preferably a non-isotropic CVD microstructure, may be achieved in refurbished carbon brake component(s) in process runs completed in 48 hours, preferably in 24 hours, or less.

BRIEF DESCRIPTION OF THE DRAWINGS

The invention will be better understood by reference to the following detailed description and accompanying drawings in which.

DESCRIPTION OF THE PREFERRED EMBODIMENT

Aircraft carbon brakes suitable for refurbishment include multiple disc friction brakes comprising a plurality of carbon-carbon rotor discs interleaved with a plurality of carbon-carbon stator discs. Worn carbon brake pressure plates and end plates also may be refurbished.

Any worn carbon surfaces of aircraft brakes may be refurbished by the method of this invention. Suitable aircraft brakes are known to those skilled in the art, and include, but are not limited to, those disclosed in U.S. Pat. Nos. 3,934,686, issued Jan. 27, 1976, to Stimson, et al.; 4,613,021, issued Sep. 23, 1986, to Lacombe, et al.; 4,465,165 issued Aug. 14, 1984, to Bok; 4,511,021, issued Apr. 16, 1985 to Grider, 4,804,071, issued Feb. 14, 1989; to Schultz, et al., 4,982,818, issued Jan. 8, 1991, to Pigford; and 5,143,184 issued Sep. 1, 1992, to Snyder, et al., which are hereby incorporated by reference.

Worn carbon rotor and stator discs may be refurbished by removing them from the brake assemblies and grinding them to one-half of their original thickness. The ground discs may be densified by the chemical vapor deposition method herein to restore original density and wear properties, or two ground discs may be used in place of one original disc when the brakes are reassembled. Optionally, the ground discs may be bonded together. One such technique for bonding two worn discs to create one refurbished disc is disclosed in U.S. Pat. No. 4,465,165, issued to Pigford Aug. 14, 1984. Following refurbishment, carbon discs may be treated with protective materials such as are disclosed in U.S. Pat. No. 4,837,073 issued Jun. 6, 1989 to McAllister, et al., to protect against oxidation.

Figure 1:
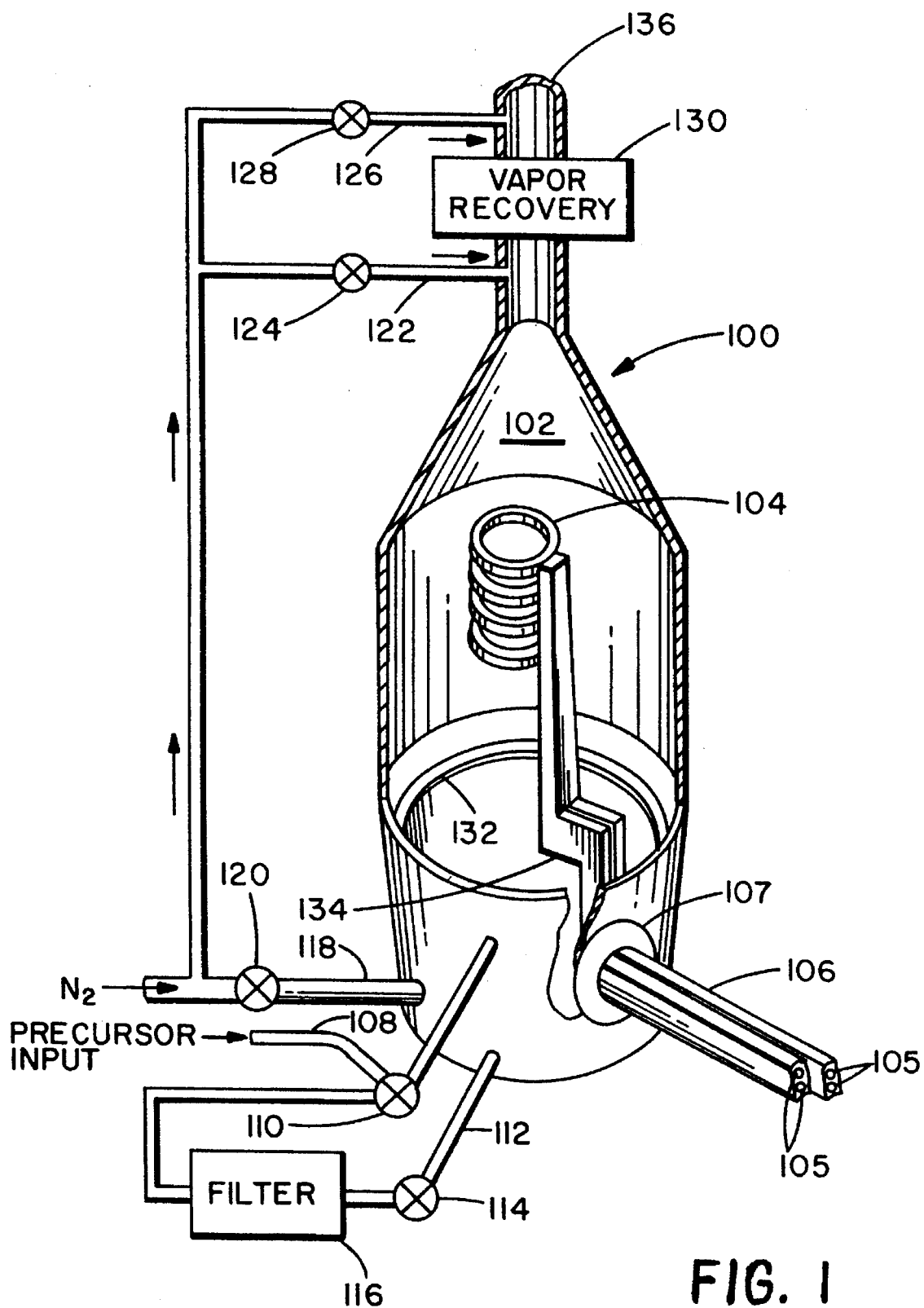
FIG. 1 is a schematic of a reactor for densifying preforms.

FIG. 1 shows a reactor 100 suitable for performing rapid densification according to the method described in U.S. Pat. No. 4,472,454. When an induction coil, such as coil 104, is used to heat a preform, reactor 100 is preferably made from nonmagnetic materials such as quartz, glass, aluminum, stainless steel, ceramic, PMC or combinations thereof.

Reactor 100 contains a cavity 102 in which a preform (not shown) is densified. In operation, cavity 102 is filled with a precursor liquid sufficient to at least cover the preform (not shown). The precursor liquid is any liquid which will boil and create a vapor containing chemicals that will deposit at a temperature to which the preform (not shown) can be heated. The precursor liquid should also be a dielectric. Preferably, the dielectric constant of the reagent liquid should be above 0.5, more preferably above 1, and most preferably above 1.5. To deposit carbon on the preform, a hydrocarbon with appropriate boiling point such as cyclopentane, cyclohexene, hexene-1, gasoline, toluene, methycyclohexane, cyclohexane, n-hexane or benzene, or a combination thereof could be used.

Within cavity 102, an induction coil 104 is positioned. In operation, induction coil 104 will be covered by the precursor liquid and operate to heat the preform (not shown). Coil 104 is made from copper or other highly conductive material which does not react with the precursor liquid even if heated.

Electricity is provided to coil 104 through busses 106. Busses 106 are made of a highly conductive material, here copper. Currents of hundreds of amperes to thousands of amperes are preferably used to provide sufficient power to heat the preform (not shown). Because of the large amount of current, busses 106 must have sufficient cross section to avoid excess heating. Busses 106 may contain water passages 105 to carry cooling water through busses 106 and through coil 104.

Busses (106) are connected to a power supply (not shown). An AC supply is used. The voltage, current, frequency and shape of coil 104 are determined by the shape and geometry of the preform as well as preform properties using known techniques used to design induction heating apparatus. Typically, the voltage will be in the range from 5 to 750 V. The frequency will be in the range of 0.1 KHz to 300 MHz.

Busses 106 pass through seal 107 to enter chamber 102. As chamber 102 contains a precursor liquid during operation, seal 107 must be resilient and also resistant to chemical attack by the precursor liquid. It should also electrically insulate busses 106 from reactor 100 in the event reactor 100 is formed from conducting components. For example, silicone rubber could be used to seal the opening in reactor 100 through which busses 106 pass.

It is a matter of convenience that busses 106 enter the lower portion of reactor 100. If busses 106 entered the upper position of reactor chamber 102, seal 107 would still be needed. It would not have to prevent the escape of liquid, but it would have to prevent the escape of vapor from chamber 102. Busses 106 could even enter chamber 102 by moving down stack 136, in which case no special seal would be needed. However, it is desirable to keep busses 106 as short as possible to reduce power loss in the busses.

Precursor liquid is supplied to reactor 1 00 through precursor input 108 via valve 110. Initially, chamber 102 is filled with precursor liquid at least of sufficient quantity to cover the preform (not shown). In operation, precursor liquid may be consumed in the deposition reaction or escape from reactor 100 as vapor. Accordingly, precursor input 108 may be utilized during operation of reactor 100 to replace precursor liquid which is dissipated.

During a densification operation, the liquid precursor may become clouded. Accordingly, valve 114 may be opened to allow precursor liquid to flow through reagent return 112 to filter 116 where it is filtered and pumped back into reactor 100. Filter 116 may be any suitable filter such as a porous ceramic screen or, more preferably, charcoal.

The reagent liquids as used herein are potentially inflammable. Accordingly, it is preferable that the densification operation be performed in an inert atmosphere. For example, nitrogen gas may be used. To purge cavity 102 of air, valve 120 is opened to allow nitrogen to flow through input 118. Valve 124 may be opened to more rapidly and effectively purge vapor recovery system 130. Once the atmosphere in chamber 102 is replaced by nitrogen, valve 128 may be opened to provide nitrogen directly into vent stack 136. This flow of nitrogen will prevent air from reaching cavity 102 and valves 120 and 124 may be closed. Closing valves 120 and 124 reduces the flow of gas through vapor recovery system 130. Vapor recovery system 130 may therefore operate more efficiently.

Vapor recovery system 130 is a system of the type known in the art for recovering vaporized liquids. Such a system will reduce the amount of waste generated in the process and the amount of precursor used.

In operation, a carbon brake (not shown) is placed in cavity 102 in close proximity to coil 104. Example coil locations are shown in more detail in FIGS. 3, 5, and 6. The carbon brake is preferably placed in a support fixture to firmly hold the carbon brake at a constant position in relation to the reactor and coil. The exact shape of the fixture is based on the shape of the carbon brake. Such a fixture could be supported in any convenient way, such as on lip 132.

It may be desirable to use different sizes or shapes of coils based on the shape of the carbon brake. For this reason, coil 104 is connected to busses 106 at connector 134. Connector 134 continues the electrical circuit comprising busses 106. It also continues the water flow circuit formed by channels 105. Connector 134 may simply be a block of metal allowing anchoring points for screws (not shown) to hold the base of coil 104 to busses 106. The joints in the water flow circuit could be sealed by flexible "O" rings or in some other convenient fashion. The material must be resistant to degradation in both water and the precursor liquid. Viton or silicone rubber may be used for this purpose. Other attachment arrangements, such as slots and grooves or clips, could also be used.

Figure 2B:
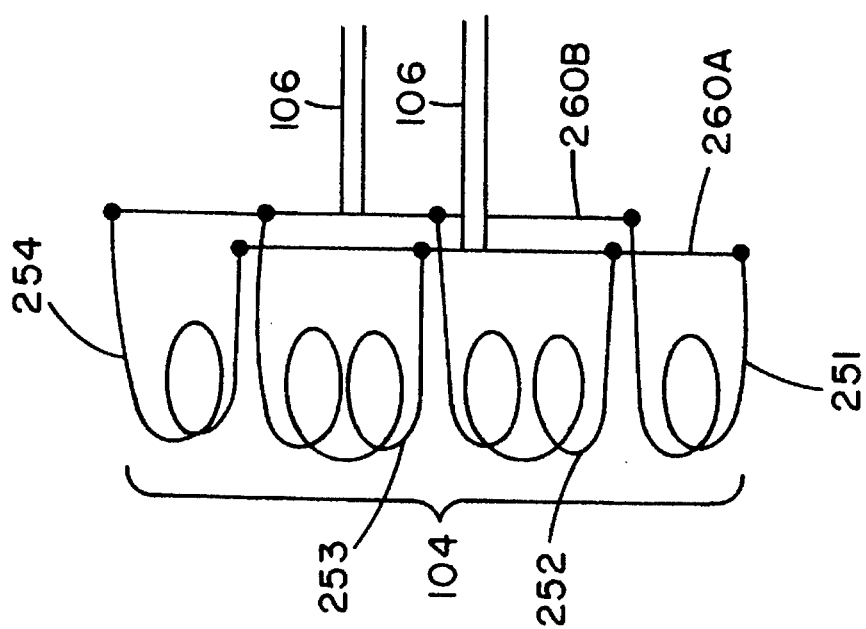
FIG. 2B is a schematic of a coil as used in the reactor of FIG. 1.
Figure 2A:
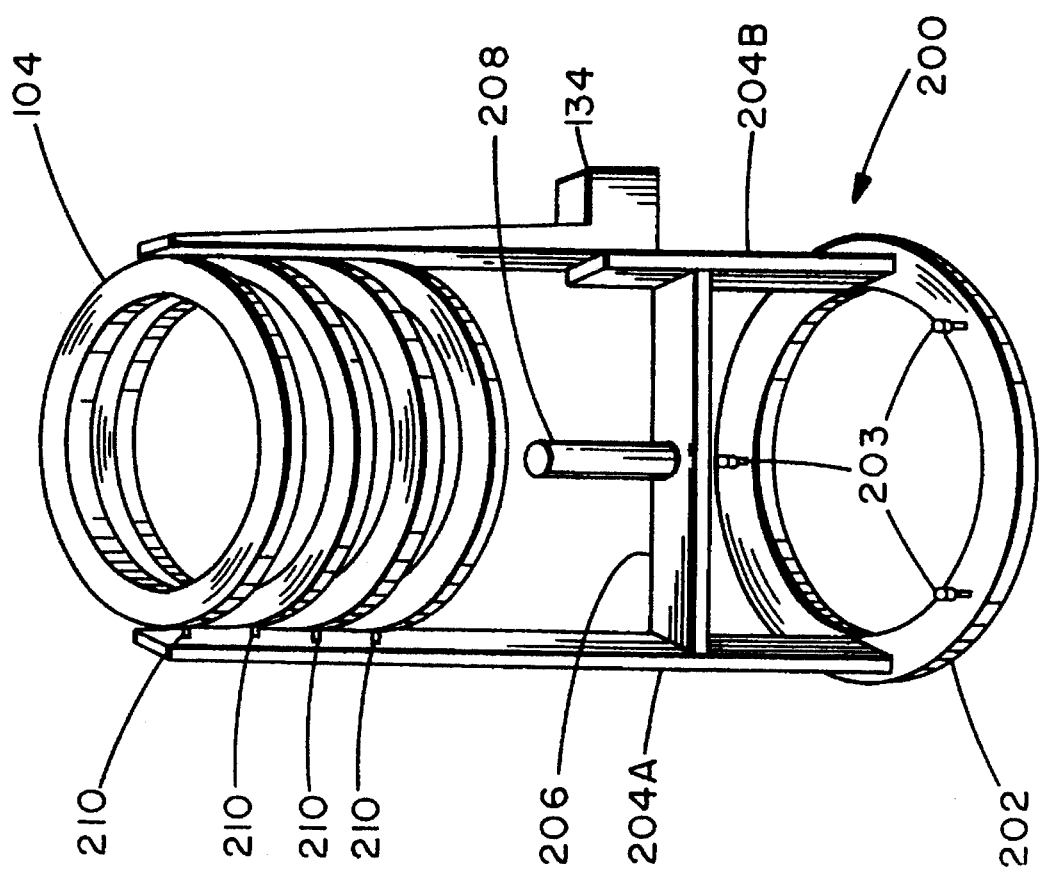
FIG. 2A is a sketch of a fixture used to hold a preform in the reactor of FIG. 1.

FIG. 2A shows a sketch of a mounting fixture 200 for use in conjunction with the reactor of FIG. 1. Fixture 200 contains a ting 202 of appropriate size to seat on lip 132 (FIG. 1). Screws 203 pass through ring 202. Screws 203 may be screwed into lip 132 (FIG. 1) to attach fixture 200 to reactor 100 (FIG. 1). Alternatively, screws 203 may just rest on lip 132 (FIG. 1). In this way, screws 203 act to adjust the vertical angle of fixture 200 relative to lip 132 (FIG. 1).

Being able to adjust the vertical angle of fixture 200 can be useful if coil 104 is fixedly attached to reactor 100 (FIG. 1). As fixture 200 holds a carbon brake, adjusting the vertical angle of fixture 200 will also adjust the position of the carbon brake relative to coil 104. As it is preferable that the carbon brake be positioned so as to be concentric with the coil, being able to adjust either the location of the carbon brake or the coil is desirable.

Fixture 200 comprises vertical members 204A and 204B. A horizontal member 206 spans vertical members 204A and 204B. A post 208 is attached to horizontal member 206. A carbon brake is attached to post 208 in any convenient way. For example, if the carbon brake is a arranged around a mandrel, a pin through the mandrel might be inserted into post 108. As horizontal members 204A and 204B, vertical member 206 and post 208 will be in close proximity to induction coil 104, it is preferable that they be made of nonmagnetic material (having a magnetic permeability of approximately 1). They should, however, be of a material strong enough to provide support to the carbon brake. Glass epoxy composite could be used. As post 208 may be in contact with a carbon brake which is heated, it should be made of a material which is a good thermal insulator and can withstand high temperatures. Post 208 is more preferably made from quartz.

To ensure the proper relationship between a carbon brake and coil 104, it may be desirable to secure coil 104 directly to fixture 200. Coil 104 could then be secured to vertical member 204 with non-conducting pins 210.

FIG. 2B shows coil 104 in greater detail. Optionally, coil 104 is made of a plurality of coil segments 251, 252, 253, and 254 electrically connected in parallel. Coil segments 251–254 are connected to conducting rods 260A and 260B. Busses 106, which supply power to coil 104 are connected to conducting rods 260A and 260B. As shown in FIG. 2B, busses 106 are connected to the center of conducting rods 260A and 260B. Coil segments 251-254 are thus symmetrically disposed around the source of power. As a result, any voltage drops, which may be significant when large currents are used, are averaged out along the length of coil 104. More uniform heating of a carbon brake thus results.

To provide more uniform heating, the length of each coil segment may optionally be different. For example, since coil segments 252 and 253 are closer to the power feed from busses 106, they could be made longer, such as by having more turns, than coil segments 251 and 254. Coil segments 252 and 253 could be sized such that the resistance in the circuit from busses 106 though any coil segment 251–254 is identical.

Coil 104 may optionally be designed to have non-uniform turn density along its length to account for gravity effects on the process. For example, vapor generated by the boiling precursor liquid will rise along the carbon brake. It is possible that the amount as well as the velocity of the vapor will be greater at the top of the carbon brake than at the bottom. As a result, heat transfer out of the carbon brake may be different at the top than at the bottom. To counter this effect, it is possible to structure coil 104 to provide different heating at the top of the carbon brake. For example, the turn density of the coil could be less at the top or the spacing between the coil and the carbon brake could be less at the top.

Figure 3:
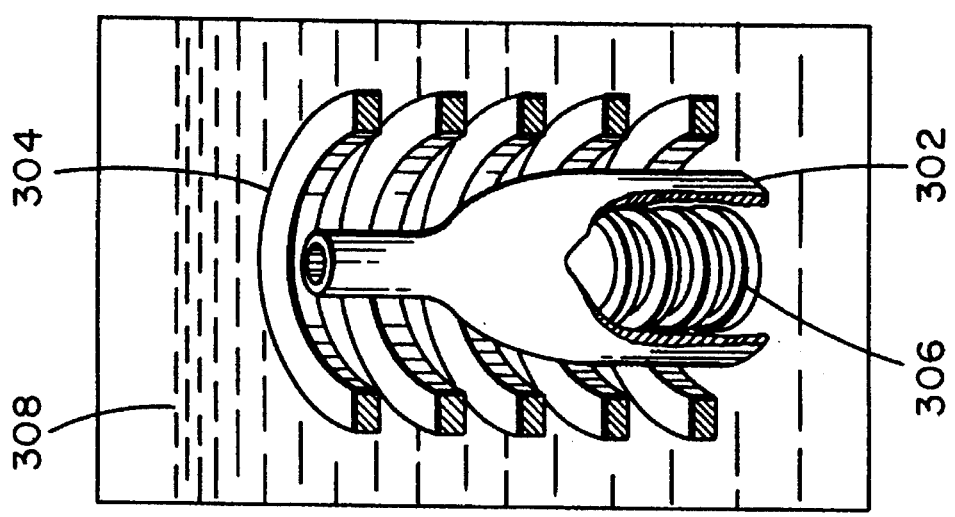
FIG. 3 is a sketch of a preform heated with an alternative coil configuration.

FIG. 3 shows the relationship of a preform 302 to a coil 304 inside a reactor 300. Preform 302 is in the center of coil 304 and both are immersed in a precursor liquid 308.

For induction heating applications, the coil is generally shaped to conform to the pan to be heated. The diameter of the coil might be smaller where the diameter of the part is smaller. Alternatively, the turn density of the coil can be increased in areas where the object to be heated is further from the coil.

Coil 304 could be shaped to conform to preform 302. Alternatively, a second coil, coil 306, may be inserted inside preform 302. The current flow through each coil should be such that the magnetic flux generated by each coil are in phase in preform 302. Preferably, both coil 304 and 306 are connected to the same power supply to ensure that the contents through them are in phase. The arrangement of FIG. 3 is, of course, only useful for hollow preforms. With both coils 304 and 306 in place, the magnetic flux is more uniform throughout preform 302. Regions of preform 302 which are further from coil 304 and thus not effectively heated by coil 304 are closer to coil 306 and more effectively heated by it. In this way, uniform preform heating may be achieved without specifically engineering a coil for each preform.

Figure 4:
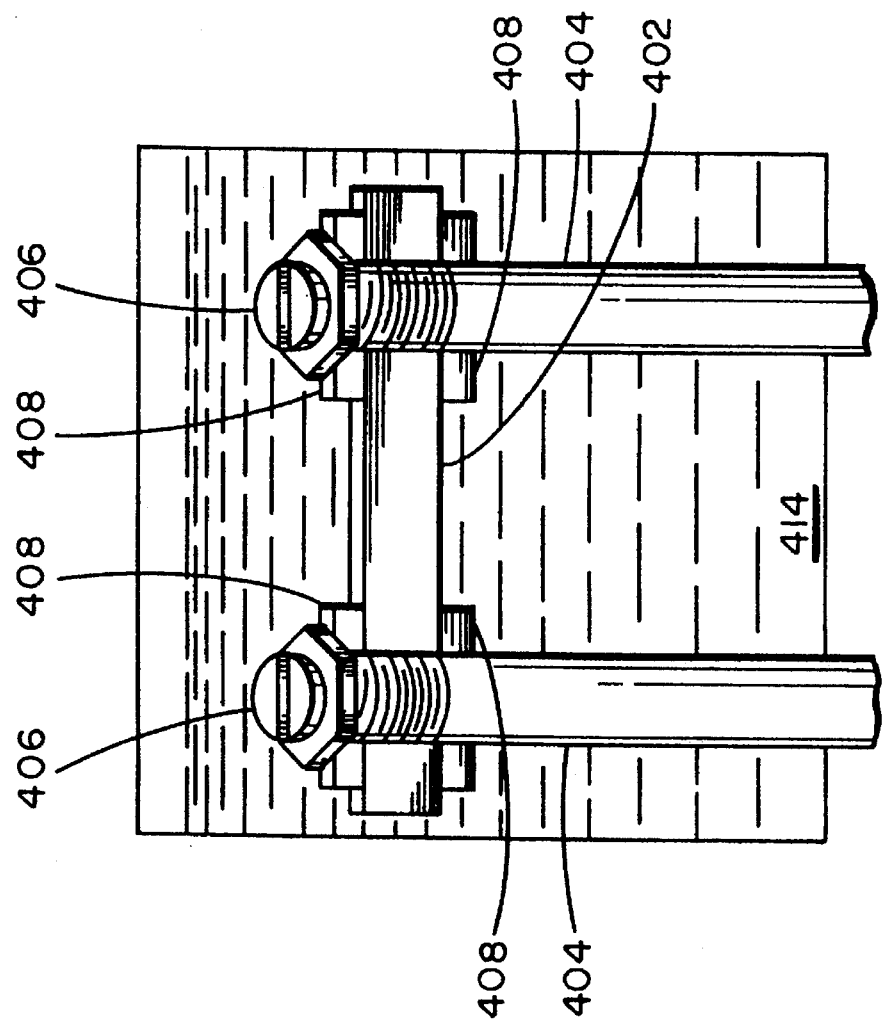
FIG. 4 is a sketch of a preform heated resistively.

FIG. 4 shows an alternative method of heating preform 402. Here, preform 402 is in the shape of a bar or a rod. Preform 402 is clamped between electrodes 404. Preform 402 is clamped in any convenient means to provide good electrical and mechanical connections.

Electrodes 404 are made from any convenient material which can carry the current required to densify the part without heating significantly or reacting with the precursor liquid.

Here, electrodes 404 are made from three quarter inch copper rods which have slits 406 formed in them. Copper shims 408 are placed in the slot around preform 402. The shims 408 are pressed into preform 402 by bolts 410 tightened onto threaded ends 4 12 of electrodes 404.

In operation, preform 402 is placed in a precursor liquid 414. Electrodes 404 are connected to a power supply (not shown) which provides a current flow through preform 402 which heats preform 402. When the resistance of the preform is low, such as when the preform is made of carbon fiber or is made of some fiber held together by a carbonized resin, a high current supply is preferable. The amount of current needed will depend on the cross sectional area of preform 402 as well as its resistivity. However, the current should be sufficient to heat some part of preform 402 above the pyrolysis temperature of precursor liquid 414. Currents on the order of 1,000 amperes are likely to be needed, though the exact current level may be set empirically based on temperature measurements of the preform. Direct current is preferable, but AC current might also be used. It may also be necessary to change the current as the densification of preform 402 proceeds. As preform 402 becomes more dense, its resistance is likely to decrease, requiring an increase in current to maintain the same level of heating. For that reason, it may be preferable to use a pyrometer to continuously or periodically measure the temperature of the preform and then adjust either the voltage of the supply to keep the desired current or to adjust the current directly.

The apparatus of FIG. 4 is particularly suitable for densifying preforms in shapes with uniform cross sections, such as bars or rods or tubes with uniform diameter and wall thickness, flat plates, or other shapes with a uniform cross sectional area perpendicular to the direction of current flow. Such preforms may be in the finished, or "net" shape. Alternatively, disks or other shapes may be cut out of the rod, bar, flat plates or offer shapes after densification. In this way, parts with non-uniform cross sections may be densified. Alternatively, several parts may be cut out of one densified piece, effectively allowing several parts to be densified simultaneously in one reactor with only one power supply.

FIG. 4 shows preform 402 oriented horizontally in a reactor vessel. Any orientation could be used.

Figure 5:
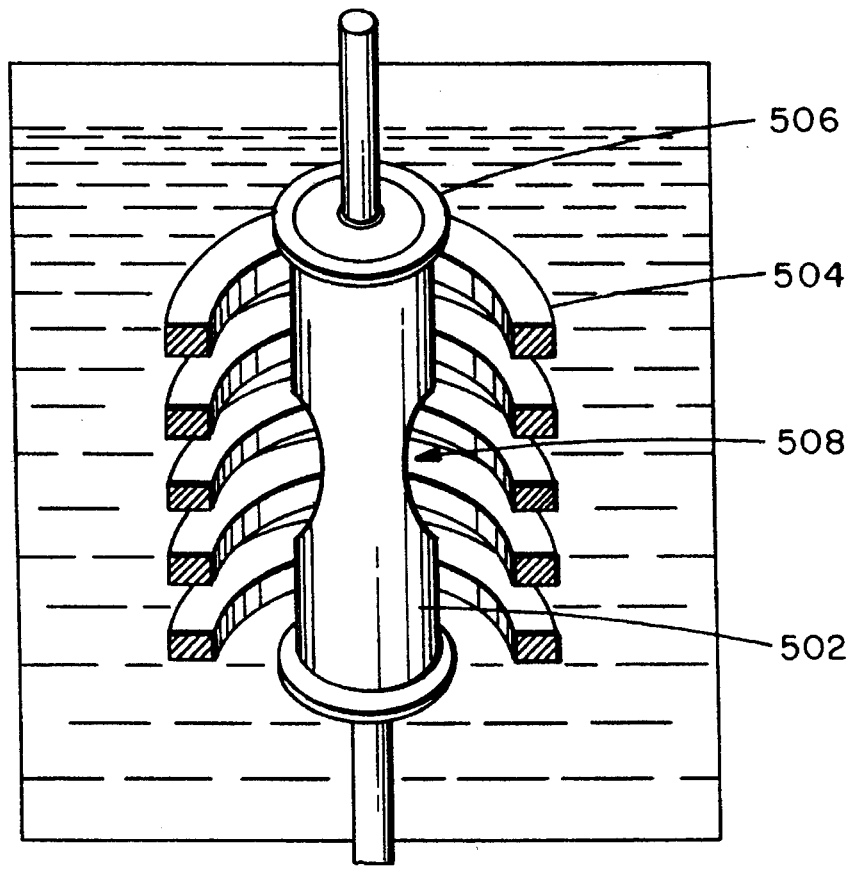
FIG. 5 is a sketch of a preform heated both inductively and resistively.

FIG. 5 shows an alternative configuration for densifying a preform 502. Preform 502 is placed inside an induction coil 504. The ends of preform 502 are coupled to electrodes 506. When coupled to appropriate power supplies as described above, coil 504 provides induction heating of preform 502 and electrodes 506 facilitate resistive heating.

Preform 502 contains a concave region 508. For uniform heating using resistive heating, preforms with concave regions or regions of nonuniform cross section are generally undesirable as the current density and hence the heating, increases in concave regions. Likewise, concave regions are detrimental to uniform heating using inductive heating since, without a special coil design, concave regions are not heated as well as surrounding areas. However, using both resistive and inductive heating tends to provide more uniform heating since hot spots associated with resistive heating tend to be canceled by cold spots of inductive heating. Accordingly, it is possible to uniformly heat preform 502 without a special coil design to conform to the contours of preform 502.

The combination of resistive and inductive heating also provides an advantage in allowing better control of preform heating. For the preform to densify most fully, it is desirable that the center of the preform initially be heated above the pyrolysis temperature of the precursor liquid. A temperature gradient is established decreasing from the center of the preform to the periphery due to the cooling effect of the precursor liquid. With this temperature distribution, deposition of densifying material preferentially occurs at the center of the preform. As densification proceeds, it is desirable that regions of the preform moving successively radially outward from the center exceed the pyrolysis temperature. Resistive heating generates heat nearly uniformly across the cross section with only second order differences due to the change in resistivity due to the temperature gradient. With the precursor liquid cooling the exterior of the preform, the resulting temperature profile is hottest in the center and coolest at the edge. Additionally, for some preforms, the resistance will drop with increased temperature such that current, and hence additional heat generation, will be concentrated at the hotter interior portions of the preform. This temperature distribution is well suited for the start of the densification cycle.

Conversely, induction coil 504 causes heat to be generated in greater amounts near the periphery of the preform. The amount of heat generated drops to 14% of its maximum value at the skin depth. The skin depth is in turn a function of frequency, decreasing in inverse proportion to the square root of the frequency. By appropriately selecting frequency using known techniques familiar to those skilled in the art of induction heating, induction coil 504 may provide greater heating at the periphery of the preform. This heat distribution is desirable at the end of the densification cycle. Accordingly, desirable results can be achieved by initially heating preform 502 resistively and then increasing the current through coil 504. Current through electrodes 506 could be simultaneously decreased if desired.

A similar heat distribution during the densification cycle could also be obtained by an induction coil above. The frequency of the power supply is initially set to provide a skin depth of roughly one quarter to one third the diameter of the preform. This skin depth, taking into account heat transfer out of the preform, will provide maximum heat accumulation at the center of the preform. Ideally, the power in the coil will be set to heat the preform to slightly above the pyrolysis temperature of the precursor liquid while the precursor liquid cools the remainder of the preform to be below the pyrolysis temperature. As the center of the preform densities, the frequency of the power supply can be increased to heat the preform to slightly above the pyrolysis temperature in regions slightly displaced from the center. Also, the power supplied in the coil may be slightly reduced to ensure that the remainder of the preform remains below the pyrolysis temperature of the precursor liquid. Adjustments can be made in tiffs fashion until the preform is fully densified. The exact rate of change of frequency and power will depend on the shape and composition of the preform and may need to be determined empirically.

Even if an induction coil is used without a resistive source, a desirable result may be obtained by increasing the power to the induction coil as the densification cycle proceeds.

Figure 7:
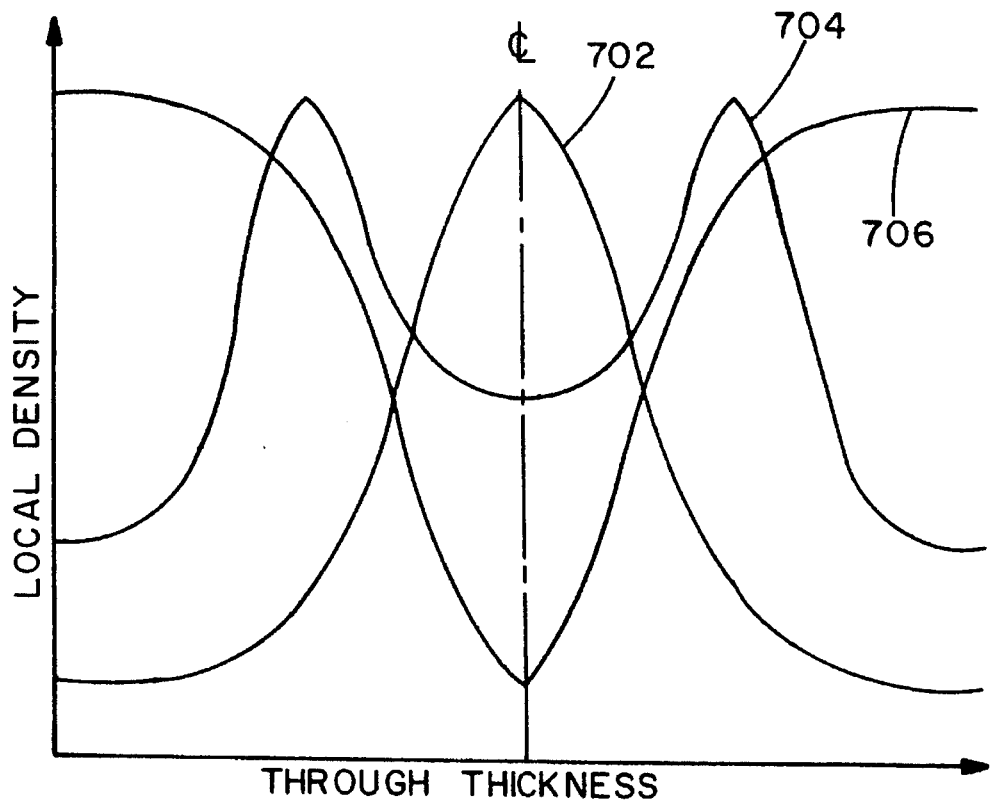
FIG. 7 is a graph of densification profiles at various power levels.

FIG. 7 shows three curves useful in understanding how increasing power during the densification cycle can provide more complete densification. FIG. 7 shows curves 702, 704, and 706, each of which shows the density of a densified preform as a function of distance from the center of the preform thickness. Curve 702 is made at a relatively low input power. The density is a maximum at the centerline. This densification pattern results because the center heats to a temperature sufficient to cause pyrolysis of the precursor liquid. The outside of the preform is cooled such that no pyrolysis and associated deposition reactions result. Curve 706 is made at a relatively high input power. Maximum density occurs at the periphery because the periphery heats to a temperature high enough to cause pyrolysis of the precursor. Pyrolysis causes deposits which block the infiltration of the precursors into the center of the preform. Curve 704 is made at an intermediate power and shows a maximum density intermediate the centerline and the periphery.

Figure 8:
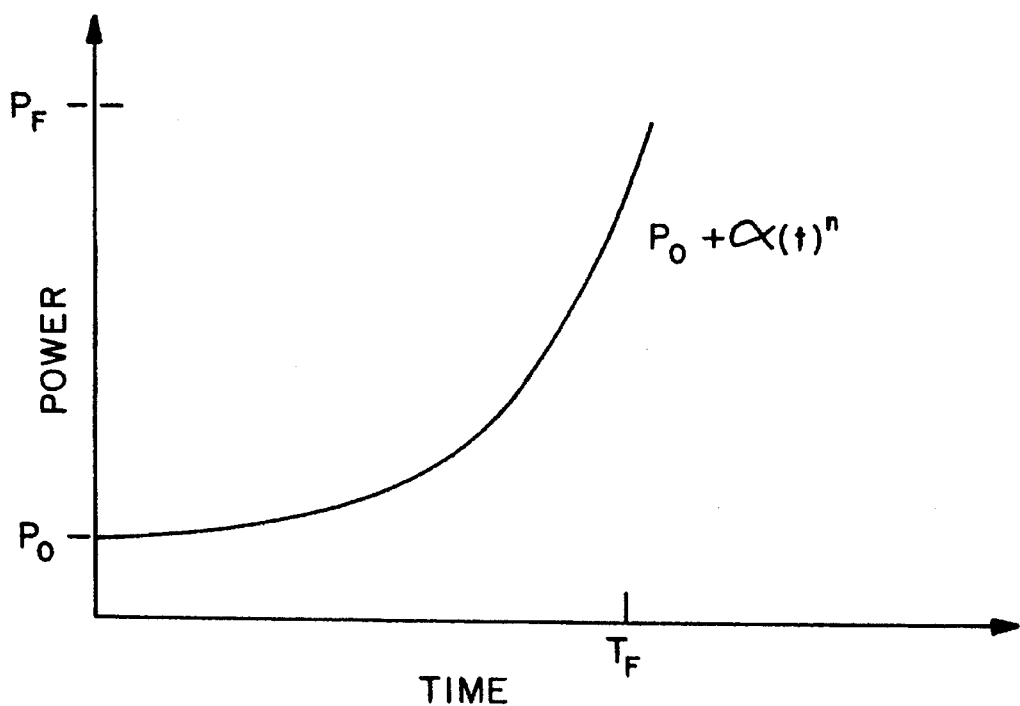
FIG. 8 is a representative graph of input power to the coil in the reactor vessel versus time.

To provide improved densification, it is desirable to initially use a power $P_o$, such as was used to create curve 702. At the end of the densification cycle, it is preferable to use a power, $P_f$, such as was used to create curve 706. In between, it is better to use a power which gives a curve such as 704. FIG. 8 shows a curve of desirable levels of input power as a function of time, P(t), during the densification cycle. The power is initially set at $P_o$. At the end of the densification cycle at time $T_f$, the power equals $P_f$; During the densification cycle, the power is increased. As shown in FIG. 8, the power is increased in proportion to time, t, raised to the power n. This relationship is desirable because the chemical reaction which causes deposits increases with increasing temperature. Thus, less time is needed to densify the outer portions of preform. Also, the other portions of the preform densify to some extent while the interior is being densified. As a result, the peripheral portions of the preform densify much faster than the interior and less time is needed to densify the outer portions of the preform.

The values of $\propto$, $P_o$, $P_f$, $T_f$, and n depend on such things as preform size and geometry as well as on the specific precursor liquid used. It is possible to theoretically calculate those values. However, due to the complicated nature of the phenomena involved, it can be preferable to empirically determine appropriate values. Several trial runs, stopped periodically to observe the preform and measure its density, may be necessary to determine appropriate values. Values of n in the range of 1 to 5 have been observed to be satisfactory for carbon brake component(s) as shown herein. However, other values may be desirable for other geometrics.

It should be noted that FIG. 8 shows a continuous change in power. The power may, however, be increased in discrete steps. Also, the same pattern of varying input power may be used regardless of the method of heating the preform. Further, the curve of FIG. 8 shows that the power is continually applied. As described hereafter, it may be beneficial to periodically pulse the applied power between an "on" state and "off" state or a reduced level. If a pulsed power source is used, the curve of FIG. 8 represents the power in the "on" state.

A further way of controlling the deposition is to adjust the pressure in the reactor chamber. Initially, it is desirable to cool the periphery of the preform so that deposition occurs principally at the interior. Cooling occurs by boiling or vaporization and convection of the precursor liquid, in addition to radiative heat transfer. Once the center of the preform has been densified, less cooling of the periphery is desirable so that densification of the exterior of the preform will densify rapidly. To reduce the cooling, the pressure of the reactor chamber may be altered. For example, the pressure might be simply increased by choking off vent stack 136.

As described above, it is desirable to have densification occur preferentially at the interior of the preform. The foregoing process control techniques relate to controlling a densification process by controlling heating of the preform. It is also possible to control the diffusion of vapor into the preform.

If more vapor reaches the interior portions of the preform or the concentrations of vapor in the interior of the preform increases, densification will occur preferentially at the interior of the preform.

One way to increase the concentration of materials which will form a deposit in the interior of the preform is to pulse the heating of the preform. Pulsing the heating allows by-products generated when the vapor forms a deposit to diffuse out of the preform when no heating is occurring or heating is reduced. For example, if cyclohexane is used as a precursor liquid, $H_2$ is generated as a by-product. If the power to the coil (when induction heating is used) or the power to the preform (when resistive heating is used) is periodically interrupted for a period long enough to allow $H_2$ to diffuse out of the preform, when heating is resumed, more cyclohexane vapor can diffuse into the preform. The concentration of the cyclohexane vapor will then be higher because the $H_2$ has dissipated.

The heating needs to be interrupted for a relatively short period of time. The length of time depends on the size of the preform and also the stage of densification. It might take longer for the by-products to diffuse out of the center of a thick preform then out of the edges. As a result, it may be desirable to interrupt the heating for longer periods of time during the early parts of the densification cycle when the interior of the preform is densifying. Heating, preferably, should be interrupted for a period of between 0.01 seconds and 10 minutes, more preferably 0.01 to 3 minutes. Heating should be interrupted at intervals of a length inversely proportional to the rate at which the by-products are generated, preferably between about 0.01 seconds and 3 minutes.

Interrupting the heating also provides an additional advantage of making a stronger finished part. The strength of the densified part is due in part to the strength of the deposited material. The strength of the deposited material is in turn dictated by its microstructure. As the material is deposited, crystalline domains grow. The part is stronger though, if all the domains are small. Interrupting heating long enough for the part to cool to a temperature which would cause renucleation, results in smaller domains. Domains smaller than the diameter of the fiber used to make the preform, typically below 5 microns, are considered small.

The heating should be applied to the perform for the time it takes the domain to grow to the desired size. Times of approximately 0.1 seconds to 5 minutes are typical. The heating should than be interrupted for long enough for the preform to cool below the renucleation temperature. Times of 0.01 seconds to 10 seconds are typical. Since the deposition is exponentially dependant on temperature, cooling of as little as 10° to 200° C. may be sufficient to cause renucleation.

Controlling the grain size is also important in making friction material, such as is used in brakes. Smaller domains may lead to a different coefficient of friction than larger domains. Controlling the domain size thus allows the materials within the desired coefficient of friction to be made.

It should be noted that the pulses need not be of constant duty cycle or occur at constant intervals. For example, as shown in FIG. 8, the power level may change during the densification cycle. The pulse characteristics might be changed with the power level.

An alternative way to increase the deposition of material in the interior of the preform is through the use of pressure waves in the liquid precursor. These waves are accentuated in the vapor as density waves which force precursor into the part and draw by-products out. In the system as described above, pressure waves exist in the liquid due to generation and contraction of bubbles associated with boiling the liquid precursor. The magnitude of the waves could be increased by cooling either the precursor liquid or the exterior of the reaction vessel. For example, in FIG. 1 filter 116 could contain a refrigeration section to cool the liquid. Alternatively, reactor 100 could be jacketed by water or some other cooling mechanism.

An alternative approach to generating pressure waves in the precursor liquid is to place one or more transducers in the precursor liquid. An acoustic or ultrasonic transducer could be used. The transducer could be pulsed to generate waves in the precursor liquid. Mechanical agitation or stirring of either the preform or precursor liquid could also be used.

Figure 6:
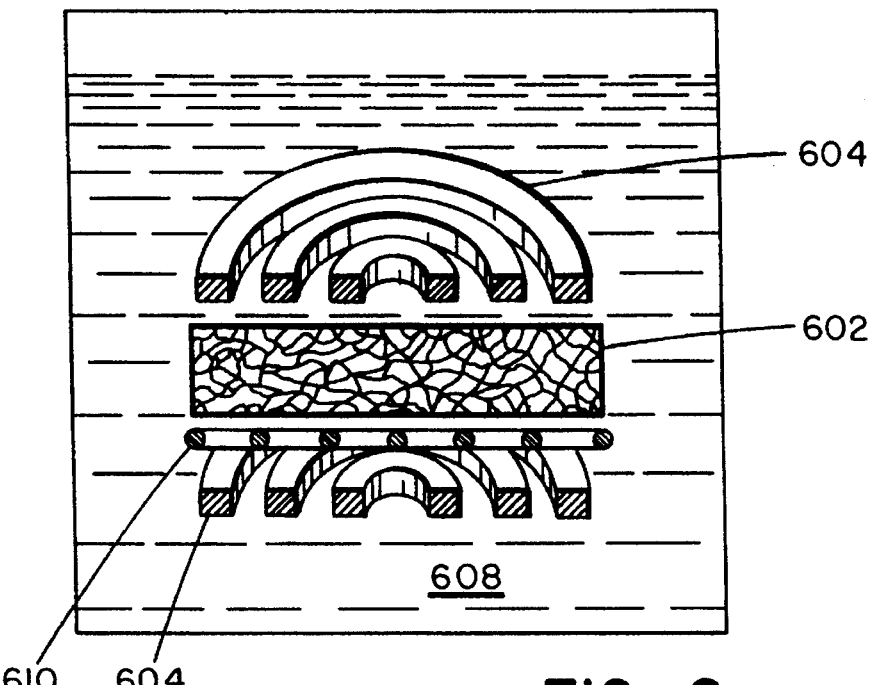
FIG. 6 is a sketch of a preform heated with an alternative coil configuration.

FIG. 6 shows an alternative coil arrangement preferred for densifying and refurbishing brake discs. Here, a disk shaped preform 602 is placed between "pancake" coils 604. Pancake coils 604 will provide a more effective heating in the center of some preforms, such as preform 602, than would a coil shaped, for example, as coil 304 (FIG. 3). Pancake coils are also useful for preforms in which the through-the-thickness resistivity is high or for heating preforms which contain edges which would be along the axis of a coil such as coil 104 (FIG. 1).

FIG. 6 shows pancake coils 604 to have uniform spacing between successive turns. Nonuniform spacing may be desirable in some instances. For example, if preform 602 is a disk with a hole in its center, the turn density might be increased in the region halfway between the outside of the preform and the outside of the hole in the center of the preform. Design techniques conventionally used for induction heating systems are preferably employed.

FIG. 6 shows preform 602 resting on an open mesh 610. Open mesh 610 or other similar support structure holds preform 602 while still allowing precursor liquid 608 to reach the under surface preform 602. Generally, preforms for carbon-carbon composites are made of fibers held together by resin or pitch. The resin or pitch is then heated to a high temperature, converting it to carbon. The carbon is still porous and must still be densified. However, the preform is generally fairly rigid and many ways of supporting the preform are possible.

The preform of FIG. 6 is called a dry preform because it is not held together by carbonized resin or pitch. One type of dry preform is a "needled" preform, which is made by stacking up layers of fibers and poking barbed needles through the stack. The needles drag fibers through the layers locking the layers together. The resulting preform is less rigid and may need to be supported throughout its length on a structure such as a frame or mesh 610.

Dry preforms also have a higher resistivity than a preform held together with resin or pitch, thus, a higher frequency to is required heat these materials efficiently. As the preform begins to densify, the frequency may need to be decreased to compensate for the decrease in resistivity. Similar adjustments may be needed for resistive heating. The current may need to be increased to compensate for the decreased resistance.

For some preforms, very high frequencies will be needed to provide effective induction heating. Resistive heating as described herein could be used. Alternatively, high frequency energy can be generated from a microwave source rather than an induction coil. If microwaves are to be used, the reactor vessel should be made from a material which reflects microwave energy and shaped like a cavity used in a microwave furnace. Where necessary, openings in the reactor vessel must be smaller than one quarter wave length of the frequency used or covered with a conductive mesh having openings less than one quarter wavelength. Frequencies in the range of 300 MHz to 300GHz could be used, more preferably, frequencies in a range of 915MHz to 2.45 GHz could be used.

Figure 9:
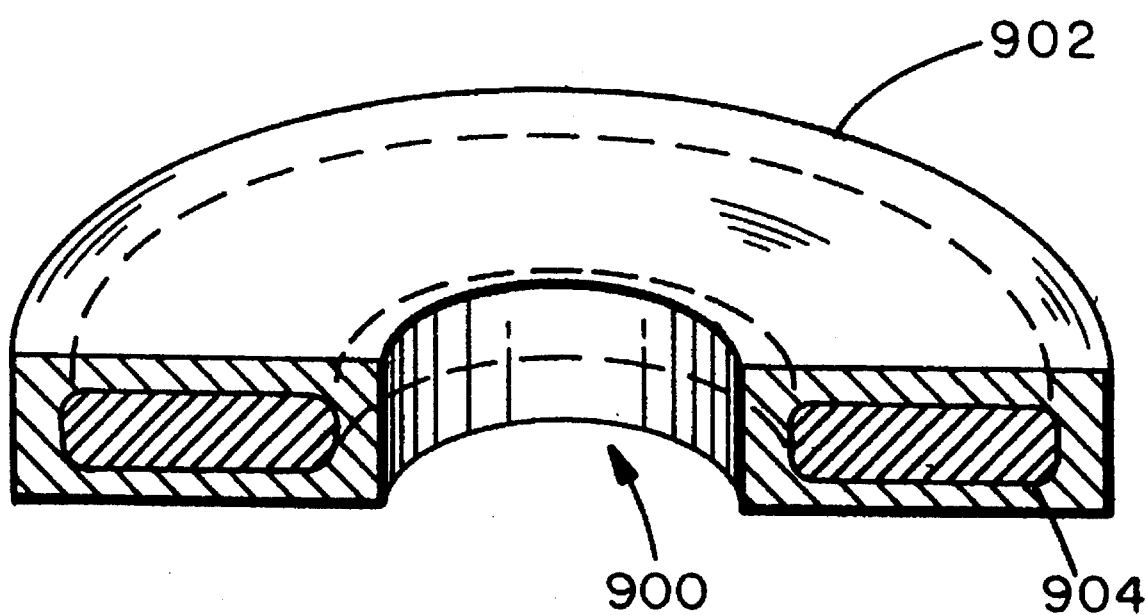
FIG. 9 is a sketch of a preform with a solid core.

An alternative to using such a high frequency power source is to incorporate a susceptor into the preform. A susceptor is a material which will heat readily. Heretofore, graphite pieces have been used as susceptors. FIG. 9 shows in cross section a disk shaped preform 900. Preform 900 has a core 904 which acts as a susceptor. Core 904 may be graphite or may be carbon or some other material which readily heat when exposed to energy of the type generated by the heating source in use.

The porous portion 902 of preform 900 surrounds core 904. Portion 902 may be applied by molding conventional carbon/phenolic material around core 904. As an alternative, a sheet of carbon felt might be placed above and below core 904. The sheets of carbon felt might then be needled together.

Core 904 might be any susceptor material. A particular useful susceptor might be a previously densified disc. For example, worn carbon/carbon discs from aircraft brakes may be machined down, and used to form core 904 to make new discs.

Having described various embodiments of the invention, one of skill in the art may make various alternative embodiments without departing from the invention. Limitless reactor shapes are possible. Many suitable materials could be found for making the equipment described herein. Also, porous billets in the form of fibrous preforms have been described, but many types of preforms could be densified with the method and apparatus defined herein. Further, carbon fiber preforms densified with carbon have been used as an example. Carbon fiber preforms could be densified with ceramics or ceramic fibers could be densified with either carbon or ceramics. Also flux concentrators could be used in conjunction with induction coils as described herein. For example, FIG. 6 shows a pancake coil, which produces a symmetrical field pattern. Flux concentrators such as ferrite balls or the commercial product Fluxtrol flux concentrator sold by the Fluxtrol Company could be used. The flux concentrator might, for example, be placed on the outside portions of the coil away from the preform to direct more of the generated flux towards the preform.

EXAMPLE 1

A tubular preform of 1.5" inside diameter and wall thickness of 38 to 40 mils and 6 inches long was built up from a plurality of overlapping sheets of conventional carbon/phenolic material in a format called involute wrap. The preform was carbonized by heating in excess of 650° C. Initial bulk density of the preform was 1.3 g/cc. The preform was densified in a reactor as shown in FIG. 1 with cyclohexane as the precursor liquid. A graphite core was placed in the center of the tube to act as a susceptor. The power supply provided 30 kWatts at a frequency of 160 kHz. Preform temperatures between 900° and 1500° C. were achieved. After 4 hours, the bulk density was 1.83 g/cc and apparent density as determined by mercury porosimetry was 2.01 g/cc. The porosity of the part was very low, 6.2 %. Testing showed that the tube had a compressive strength of 26.3 Ksi and a modulus of 44.1 Msi.

EXAMPLE 2

F-16 aircraft brakes were disassembled and worn carbon rotor discs were ground to yield a half-thickness rotor from each rotor disc. The rotors were 12 inch (30.5 cm) diameter carbon-carbon annular discs which had been used in actual aircraft operation for normal brake life-cycles.

Three rotors (Disc #2,3 and 4) were densified separately trader run conditions similar to those set forth below for rotor disc #3. Each rotor was immersed in cyclohexane contained in a reactor of the type shown in FIGS. 1 and 6. At the conclusion of densification the bulk density of the rotor was approximately equal to that of the original equipment carbon brake rotor.

TABLE I

Run Conditions: Densification of Carbon Brake Rotor Disc #3

| Elapsed Time of run Hours:Minutes | Voltage[a] Volts | Power[b] Kwatts | Frequency[c] KHz |
|---|---|---|---|
| 0 | 232.00 | 28.50 | 15.75 |
| 0:10 | 244.00 | 30.00 | 16.00 |
| 0:20 | 256.00 | 31.50 | 16.25 |
| 0:30 | 260.00 | 33.00 | 16.75 |
| 0:40 | 276.00 | 35.25 | 17.00 |
| 0:50 | 284.00 | 37.50 | 17.25 |
| 1:00 | 288.00 | 39.00 | 17.50 |
| 1:10 | 296.00 | 41.10 | 17.63 |
| 1:20 | 308.00 | 43.50 | 17.75 |
| 1:30 | 312.00 | 45.00 | 18.00 |
| 1:40 | 320.00 | 46.80 | 18.13 |
| 1:50 | 328.00 | 48.75 | 18.25 |
| 2:00 | 332.00 | 51.00 | 18.50 |
| 2:10 | 336.00 | 52.50 | 18.75 |
| 2:20 | 344.00 | 54.45 | 19.00 |
| 2:30 | 352.00 | 56.40 | 19.25 |
| 2:40 | 356.00 | 58.50 | 19.25 |
| 2:50 | 360.00 | 60.30 | 19.38 |
| 3:00 | 372.00 | 62.10 | 19.50 |
| 3:10 | 376.00 | 64.05 | 19.75 |
| 3:20 | End of Run | | |

[a]Full scale voltage on power supply used for runs was 800 volts.
[b]Full scale power on power supply used for runs was 150 Kilowatts.
[c]Full scale frequency on power supply used for runs was 25 Kilohertz.

The surface temperature of the carbon brake rotor disc was estimated to be approximately 800°–1,100° C. during the densification runs. It was generally observed that heating to an internal temperature of 950° to 1100° C. for 2.0 to 3.5 hours in cyclohexane was sufficient to refurbish worn carbon brake components to a density at least equal to that of an original equipment, or a traditionally refurbished, carbon brake component of equivalent size, density and composition which is in use in aircraft operation.

Following densification, samples of the densified rotors were subjected to post-heat treatment for 2 hours under an argon atmosphere at temperatures of 1800°, 2100° and 2400° C.

Subscale test specimens (1.25 inch outer diameter; 0.85 inner diameter) were machined from fixed points in each rotor and an anti-oxidant paint was applied to the inner and outer edges of the test specimens prior to wear and friction testing.

Example 3

To simulate wear and performance during landing conditions for F-16 aircraft (a 210 knot landing) a testing apparatus in use at Composite Testing and Analysis, University of Michigan, was set to the following parameters:

| | |
|---|---|
| rotational speed of specimens: | 31,500 rpm |
| normal force applied to disc at full speed: (pressure on disc surface: 390 psi) | 257 lbs. |

These parameters yielded a model which simulated the following maximum conditions occuring during landing of an F-16 aircraft:

| | |
|---|---|
| maximum velocity of the braking surface: | 2114 in/sec |
| maximum contact pressure between brake discs: | 390 psi |
| maximum temperature for braking surface at zero velocity: | 815° C. |

Rotor specimens were tested for ten cycles and wear measurements were taken. Coefficient of friction calculations were made using data collected only on the last five cycles to avoid surface imperfection effects. Results shown below are compared to data collected on new brake and worn brake control specimens. The "worn" brake specimens are representative of traditionally refurbished worn brakes, i.e., two worn discs are ground down and used in place of one original equipment brake disc.

TABLE 2

WEAR RESULTS AFTER TEN BRAKING CYCLES

| Rotor Specimen | Specimen Type | Sample Wear (mm) |
|---|---|---|
| New - 1a | New | 0.06 |
| New - 1b | New | 0.07 |
| New - 2a | New | 0.07 |
| New - 2b | New | 0.09 |
| New - 3a | New | 0.07 |
| New - 3b | New | 0.05 |
| Worn - 1a[a] | Worn | N/A |
| Worn - 1b[a] | Worn | N/A |
| Worn - 2a | Worn | 0.07 |
| Worn - 2b | Worn | 0.08 |
| Worn - 3a | Worn | 0.08 |
| Worn - 3b | Worn | 0.10 |
| Experimental (No Post-Heat) | | |
| RD - 1a (Disc #3) | RD ™ Only | 0.05 |
| RD - 1b (Disc #3) | RD ™ Only | 0.06 |
| RD - 2a (Disc #3) | RD ™ Only | 0.045 |
| RD - 2b (Disc #3) | RD ™ Only | 0.05 |
| RD - 3a[b] (Disc #4) | RD ™ Only | N/A |
| RD - 3b[b] (Disc #4) | RD ™ Only | N/A |
| Experimental (With Post-Heat) | | |
| HT - 1a (Disc #3) | (1800° C.) Heat Treat | 0.07 |
| HT - 1b (Disc #3) | (1800° C.) Heat Treat | 0.06 |
| HT - 2a (Disc #3) | (2100° C.) Heat Treat | 0.03 |
| HT - 2b (Disc #3) | (2100° C.) Heat Treat | 0.03 |
| HT - 3a (Disc #4) | (2400° C.) Heat Treat | 0.17 |

TABLE 2-continued

| Rotor Specimen | | | | | | |
|---|---|---|---|---|---|---|
| HT - 3b (Disc #4) | (2400° C.) Heat Treat | | | | | 0.34 |

<sup>a</sup>Sample delaminated during testing.
<sup>b</sup>Exceeded maximum test temperature.

Coefficient of Friction for Each Specimen
Pair for Last Five Braking Cycles<sup>a</sup>

| Rotor Specimen | 6 | 7 | 8 | 9 | 10 | Mean |
|---|---|---|---|---|---|---|
| New - 1a, 1b | 0.32 | 0.32 | 0.30 | 0.30 | 0.31 | 0.31 |
| New - 2a, 2b | 0.31 | 0.31 | 0.29 | 0.27 | 0.28 | 0.29 |
| New - 3a, 3b | 0.29 | 0.31 | 0.26 | 0.27 | 0.26 | 0.28 |
| Worn - 1a, 1b | n/a | n/a | n/a | n/a | n/a | n/a |
| Worn - 2a, 2b | 0.24 | 0.23 | 0.23 | 0.24 | 0.22 | 0.23 |
| Worn - 3a, 3b | 0.24 | 0.25 | 0.25 | 0.23 | 0.23 | 0.24 |
| Experimental (No Post-Heat) | | | | | | |
| RD - 1a, 1b (Disc #3) | 0.29 | 0.29 | 0.27 | 0.28 | 0.28 | 0.28 |
| RD - 2a, 2b (Disc #3) | 0.33 | 0.30 | 0.31 | 0.31 | 0.30 | 0.31 |
| RD - 3a, 3b (Disc #4) | n/a | n/a | n/a | n/a | n/a | n/a |
| Experimental (With Post-Heat) | | | | | | |
| HT - 1800° C. - 1a, 1b (Disc #3) | 0.33 | 0.33 | 0.32 | 0.33 | 0.34 | 0.33 |
| HT - 2100° C. - 2a, 2b (Disc #3) | 0.29 | 0.29 | 0.29 | 0.28 | 0.27 | 0.28 |
| HT - 2400° C. - 3a, 3b (Disc #4) | 0.40 | 0.40 | 0.38 | 0.35 | 0.34 | 0.37 |

<sup>a</sup>The data gathered throughout each test cycle included normal force, torque, and temperature. The friction force, F, is related to the friction coefficient, $\mu$, and normal force, N, by the following expression: $F = \mu N$. The torque imposed on the disc is given by the friction force, multiplied by the mean radius of the disc: $T = Fr_m$. Solving for $\mu$ gives: $\mu = T/Nr_m$. In a representative test cycle, the maximum temperature occurred at approximately 7 seconds into the test cycle. At this time interval, the torque imposed on the stationary disc was 35 in-lb. Substituting this value into the equation, along with the recorded normal force of 247 lb and a mean radius of 0.525 inches for the sample, we calculated a friction coefficient of 0.27.

The results show that exposing a half thickness worn F-16 aircraft brake to the refurbishment method herein will significantly increase the wear and friction characteristics of the brake. In these tests, use of the refurbishment method, even without post-heat treatment, gave wear properties meeting, or exceeding those of a new or a traditionally refurbished brake, without jeopardizing friction coefficients.

The wear data in Table 2 show that samples processed using a three hour densification cycle had 25% less average wear than that of the new brake samples. Table 2 data also show the results of post-heat treatment cycles on the samples. This data, though limited, suggests that exposing the brakes to elevated temperatures after refurbishment will modify both the wear characteristics and the friction coefficients of the material. The data taken from the pair of refurbished specimens which were post heat treated at 2100° C. showed 56% less wear and had the same average friction coefficient as the new brake samples.

Run conditions other than those exemplified herein may be used to refurbish worn brakes and appropriate conditions may be selected by the practitioner to accommodate variables in brake components, apparatus size and design, liquid carbon-precursor, and process conditions. Run conditions may be adjusted to accommodate simultaneous processing of multiple carbon brake component(s), with or without the use of a susceptor. The only requirement is that the conditions must yield a carbon/carbon composite microstructure characterized by friction coefficient, wear and thermal properties which are adequate for aircraft brake operations, and the chemical vapor deposition process must be completed rapidly, i.e., in less than 48 hours, preferably less than 24 hours.

Accordingly, the invention should be limited only by the spirit and scope of the appended claims.

We claim:

1. A rapid chemical vapor deposition method for refurbishing worn carbon brake component(s) for aircraft, comprising the steps of:

a) placing at least one worn carbon brake component(s), having pores defined by interior regions, including at least one geometric center region, and an exterior surface, in a liquid carbon-precursor contained within a reactor for densifying a porous structure, the reactor being adapted to contain the liquid carbon-precursor and to contain at least one internal induction coil; and b) inductively heating the interior regions of the worn carbon brake component(s) to a temperature above the decomposition temperature of the liquid carbon-precursor, thereby effecting formation of a vapor from the liquid carbon-precursor and infiltration into the interior regions of the vapor and deposition of pyrolytic carbon within the interior regions;

whereby after refurbishing, the worn carbon brake component(s) are characterized by a microstructure and frictional wear properties at least equal to those of carbon brake component(s) of equivalent size, density and composition which are presently in use in aircraft.

2. The method of claim 1, wherein the reactor is coupled to a condenser for condensing vaporized liquid carbon-precursor and returning the liquid carbon-precursor to the reactor.

3. The method of claim 1, wherein the method additionally comprises the step of heating the refurbished carbon brake(s) to a temperature of about 150° to 2400° C., following completion of chemical vapor deposition.

4. The method of claim 1, wherein at least one worn carbon brake component(s) is fully refurbished by inductively heating for 2.0 to 3.5 hours to an internal temperature of 950° to 1100° C. and an external temperature of 800° to 1100° C. in cyclohexane.

5. The method of claim 4, wherein the chemical vapor deposition step is carried out at a pressure of one-half to four atmospheres.

6. The method of claim 1, further comprising the steps:

a) setting an initial frequency and power to the induction coil, the initial frequency and power being effective to accumulate sufficient heat at a geometric center region of the worn carbon brake component to reach a temperature sufficient to cause pyrolysis of the vapor and deposition preferentially in the pores located in the geometric center region of the worn carbon brake component;

b) supplying an initial quantity of power to the induction coil at the initial frequency sufficient to heat the geometric center region of the worn carbon brake component to a temperature adequate for densifying the geometric center region without simultaneously densifying other interior regions and the exterior surface of the worn carbon brake component;

c) following densification of the geometric center region of the worn carbon brake component, supplying a quantity of power to the induction coil at one or more frequency setting(s), the quantity of power and frequency setting being effective to accumulate sufficient heat in interior regions of the worn carbon brake component to cause pyrolysis of the vapor and deposition preferentially in the pores located in the interior regions of the worn carbon brake component adjacent to the geometric center region; and d) adjusting the quantity of power supplied to the induction coil at one or more frequency setting(s), the quantity of power and frequency setting being effective to progressively densify the interior regions of the worn carbon brake component in a radial direction outwards from the geometric center region and through a thickness of the worn carbon brake component.

7. The method of claim 1, wherein the liquid carbon-precursor comprises at least one C5 to C9 liquid hydrocarbon(s).

8. The method of claim 7, wherein the liquid carbon-precursor is selected from the group consisting of cyclopentane, hexane, cyclohexene, 1-hexene, cyclohexane, gasoline, methyl cyclohexane, benzene and toluene, or a combination thereof.

9. The method of claim 1, wherein the friction coefficient of the refurbished carbon brake(s) is at least equal to the friction coefficient of an equivalent carbon brake component(s) presently in use in aircraft.

10. The method of claim 9, wherein the percentage wear during use in aircraft of the refurbished carbon brake component(s) is at least equal to the percentage wear of an equivalent carbon brake component(s) presently in use in aircraft.

11. The method of claim 1, wherein the worn carbon brake component(s) are selected from the group consisting of carbon rotors, carbon stators, carbon end plates and carbon pressure plates.

12. A rapid chemical vapor deposition method for refurbishing worn carbon aircraft brake component(s), for aircraft, comprising the steps:

a) placing at least one worn carbon brake component(s), having pores defined by interior regions, including at least one geometric center region, and an exterior surface, in a liquid carbon-precursor contained within a reactor for densifying a porous structure, the reactor being adapted to contain the liquid carbon-precursor and to contain a means for heating the worn carbon brake component(s), the means comprising at least one set of electrodes with connectors adapted to make electrical contact to the worn carbon brake component(s) and at least one power source; and b) supplying sufficient power to the worn carbon brake component(s) to resistively heat the interior regions of the worn carbon brake component(s) to a temperature above the decomposition temperature of the liquid carbon-precursor, thereby effecting formation of a vapor from the liquid carbon-precursor and infiltration into the interior regions of the vapor and deposition of pyrolytic carbon within the interior regions;

whereby after refurbishing, the worn carbon brake component(s) are characterized by a microstructure and frictional wear properties at least equal to those of carbon brake component(s) of equivalent size, density and composition which are presently in use in aircraft.

13. The method of claim 12, wherein the reactor is coupled to at least one condensor for condensing vaporized liquid carbon-precursor and returning the liquid carbon-precursor to the reactor.

14. The method of claim 12, wherein the method additionally comprises the step of heating the refurbished carbon brake component(s) to a temperature of about 1500° to 2400° C., following completion of chemical vapor deposition.

15. The method of claim 12, wherein at least one worn carbon brake component(s) is fully refurbished by heating for 2.0 to 3.5 hours to an internal temperature of 950° to 1100° C. and an external temperature of 800° to 1100° C. in cyclohexane.

16. The method of claim 12, further comprising the steps:

a) setting an initial frequency and power supply to a set of electrodes, the initial frequency and power supply being effective to accumulate sufficient heat in interior regions of the worn carbon brake component to cause pyrolysis of the vapor and deposition preferentially in the pores located in the interior regions of the worn carbon brake component, including the geometric center region; and b) adjusting the quantity of power supplied to the set of electrodes at one or more frequency setting(s), the quantity of power and frequency setting being effective to progressively densify the interior regions of the worn carbon brake component in a radial direction outwards from the geometric center region of the worn carbon brake component.

17. The method of claim 12, wherein the chemical vapor deposition step is carried out at a pressure of one half to four atmospheres.

18. The method of claim 12, wherein the liquid carbon-precursor comprises at least one C5 to C9 liquid hydrocarbon(s).

19. The method of claim 18, wherein the liquid carbon-precursor is selected from the group consisting of cyclopentane, hexane, cyclohexene, 1-hexene, cyclohexane, gasoline, methyl cyclohexane benzene and toluene, or a combination thereof.

20. The method of claim 12, wherein the friction coefficient of the refurbished carbon brake component(s) is at least equal to the friction coefficient of an equivalent carbon brake component(s) presently in use in aircraft.

21. The method of claim 20, wherein the percentage wear of the refurbished carbon brake component(s) is at least equal to the percentage wear of an equivalent carbon brake component(s) presently in use in aircraft.

22. The method of claim 12, wherein all or part of the worn carbon brake component(s) are heated with means comprising an inductive heating means and the resistive heating means.

23. The method of claim 22, further comprising the steps:

a) setting an initial frequency and power to an induction coil, the initial frequency and power being effective to accumulate sufficient heat at a geometric center region of the worn carbon brake component(s) to reach a temperature adequate to pyrolyze the vapor and deposit carbon preferentially in the pores located in the geometric center region of the worn carbon brake component(s);

b) supplying an initial quantity of power to the induction coil at the initial frequency sufficient to densify the geometric center region of the worn carbon brake component(s) without simultaneously densifying other interior regions and the exterior surface of the worn carbon brake component(s);

c) following densification of the geometric center region of the worn carbon brake component(s) supplying a quantity of power to the induction coil at one or more frequency setting(s), the quantity of power and frequency setting being effective to accumulate sufficient heat in interior regions of the worn carbon brake component(s) to cause pyrolysis of the vapor and deposition preferentially in the pores located in the interior regions of the worn carbon brake component(s) adjacent to the geometric center region;

d) providing electrical current to the worn carbon brake component(s) through the electrodes to resistively heat the worn carbon brake component(s); and e) adjusting the quantity of electrical current and the quantity of power supplied to the induction coil at one or more frequency setting(s), the quantity of electrical current and the quantity of power and frequency setting being effective to progressively densify the interior regions of the worn carbon brake component(s) in a radial direction outwards from the geometric center region and through a thickness of the worn carbon brake component(s).

\* \* \* \* \*